United States Patent
Song

(10) Patent No.: US 7,498,179 B2
(45) Date of Patent: Mar. 3, 2009

(54) SEMICONDUCTOR DEVICE HAVING FERROELECTRIC MATERIAL CAPACITOR AND METHOD OF MAKING THE SAME

(75) Inventor: Yoon-Jong Song, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 80 days.

(21) Appl. No.: 11/218,972

(22) Filed: Sep. 2, 2005

(65) Prior Publication Data
US 2006/0003473 A1 Jan. 5, 2006

Related U.S. Application Data

(62) Division of application No. 09/956,498, filed on Sep. 18, 2001, now Pat. No. 6,956,279.

(30) Foreign Application Priority Data

Sep. 18, 2000 (KR) .............................. 2000-54627

(51) Int. Cl.
*H01L 21/00* (2006.01)
(52) U.S. Cl. .......................... 438/3; 438/648; 438/649; 438/650
(58) Field of Classification Search .................... 438/3, 438/240, 618–678; 257/E21.664
See application file for complete search history.

(56) References Cited

U.S. PATENT DOCUMENTS 5,618,746 A * 4/1997 Hwang .......................... 438/3
6,190,963 B1   2/2001 Zhang et al.
6,313,539 B1  11/2001 Yokoyama et al.
6,337,238 B1 * 1/2002 Nakabayashi ............... 438/240
6,407,422 B1 * 6/2002 Asano et al. ................ 257/306
6,600,183 B1 * 7/2003 Visokay et al. ............. 257/295
2002/0024079 A1 * 2/2002 Nagano et al. .............. 257/300

FOREIGN PATENT DOCUMENTS

| JP | 10-173138 | 6/1998 |
| JP | 10-242408 | 9/1998 |
| JP | 10-242409 | 9/1998 |
| KR | 1998-0012492 | 4/1998 |

OTHER PUBLICATIONS

English language abstract of Japanese Publication No. 10-173138.
English language abstract of Japanese Publication No. 10-242408.

* cited by examiner

*Primary Examiner*—H. Jey Tsai
(74) *Attorney, Agent, or Firm*—Marger Johnson & McCollom, P.C.

(57) ABSTRACT

The present invention relates to the field of a semiconductor device having a ferroelectric material capacitor and method of making the same. The semiconductor device includes a capacitor having a triple-level oxygen barrier layer pattern formed by an oxygen barrier metal layer, a material layer formed of a conductive solid solution by compounding the oxygen barrier metal layer and oxygen, and an oxygen barrier metal on an interlayer dielectric with a contact plug. The capacitor also has an electrode and a ferroelectric film electrically contacting to the oxygen barrier layer.

Further, a wetting layer is formed between the oxygen barrier layer and the contact plug, and an iridium oxygen layer is formed between the oxygen barrier layer and a capacitor electrode.

7 Claims, 3 Drawing Sheets

SEMICONDUCTOR DEVICE HAVING FERROELECTRIC MATERIAL CAPACITOR AND METHOD OF MAKING THE SAME

This application is a divisional of U.S. patent application Ser. No. 09/956,498, filed Sep. 18, 2001, now U.S. Pat. No. 6,956,279, which is claims priority from Korean Patent Application No. 2000-54627, filed on Sep. 18, 2000, the contents of which are incorporated by reference.

FIELD OF THE INVENTION

The present invention relates to the field of a semiconductor device having a ferroelectric material capacitor and method of making the same, and more particularly to the protection of contact plugs connecting the ferroelectric material capacitor from a boundary surface oxidation of the semiconductor device.

BACKGROUND OF THE INVENTION

A FRAM (Ferroelectric Random Access Memory device) or a DRAM (Dynamic Random Access Memory device) of a semiconductor device employs a capacitor with a transistor. The more a semiconductor device is integrated, the more a size of capacitor is forced to be narrow, and thereby deterioration may occur in a semiconductor device. Therefore, in a semiconductor device having a capacitor, there exists a need for designs and methods that can achieve high capacity in a very small capacitor.

As the integration density is higher, the use of a ferroelectric capacitor in a DRAM is increased; it is indispensable in a FRAM. Though the FRAM is a kind of nonvolatile memory devices such as a flash memory device, it has been watched with keen interest due to excellent endurance of more than $10^{12}$ cycles, calculating speed of several tens of nsec, a driving voltage lower than 5V, and low power consumption. In order to be a high value-added product for the FRAM, the FRAM is in need of having cell architecture of 1-transistor/1-capacitor like a DRAM cell. Moreover, it needs to enhance the reliability involved in facilities for data retention and iterative read-out/write-in that is compatible with DRAMs, as well as employing a multi-level interconnection process.

In manufacturing high-dielectric capacitors in DRAM or FRAM devices, it is most important to prevent oxidation of a boundary surface of a contact plug connecting an electrode of a transistor and that of a capacitor. It is essential to contact a transistor with a capacitor in the architecture of 1-transistor/1-capacitor. A contact plug made of polysilicon tungsten is normally used. While the annealing is performed in an oxygen environment after depositing a dielectric film in the ferroelectric capacitor, a surface of the contact plug or a boundary surface of the material is oxidized when the dielectric film is exposed to oxygen directly or indirectly through a material that is permeable to oxygen.

The contact plug is connected to a bottom electrode of the ferroelectric capacitor. A platinum electrode, which is resistant to heat and oxidation, is used for the bottom electrode of the ferroelectric capacitor. However, the platinum electrode does not stop oxygen from penetrating. Therefore, the boundary surface of the contact plug connected to the bottom electrode is oxidized by oxygen of the dielectric film or during annealing procedure through the bottom electrode. The non-conductive silicon and tungsten (W) oxide film causes a high contact resistance, and thereby a normal operation of cell is not achieved even when only a part of the surface or boundary surface is oxidized.

Therefore, in forming a ferroelectric capacitor, an oxygen barrier layer is generally needed between the contact plug and the bottom electrode in order to prevent the boundary surface from oxidizing. Many materials have been studied for an oxygen barrier layer. The oxygen barrier needs to be made of a material that is a conductor itself and not oxidized, that keeps the conductivity even though the material has been oxidized, or is impermeable to oxygen, even if it is oxidized. The material for the barrier layer preferably adheres well to a capacitor bottom electrode and a contact plug, and is adaptable to them in forming an ohmic contact.

Recently, precious metals such as iridium, ruthenium, osmium, etc., have been used for the oxygen barrier of the ferroelectric capacitor. For example, referring to Japanese patent publication No. JP1998-242408, it can be seen that a titanium wetting layer, an iridium-yttrium-oxygen compounding barrier layer, and a titanium wetting layer are constructed between a contact plug and a platinum bottom electrode. Further, referring to Japanese patent publication No. JP1998-173138, a multi-level oxygen barrier layer of a titanium ohmic contact layer, a titanium nitridefilm for silicon diffusion barrier layer, and an iridium/iridium oxide/iridium multi-layer are constructed between a contact plug of silicon and a bottom electrode of a ferroelectric capacitor.

The conventional architectures of oxygen barrier layers prevent oxygen from diffusing beyond the barrier layer. However, even though a very small amount of oxygen may enter into the barrier layer, the oxygen that penetrates the barrier layer forms an oxide film in a boundary surface of the contact plug connected with the barrier layer, and thereby contact resistance may be increased and a cell may not operate normally. Namely, it creates problems by increasing the required driving voltage and operating time.

With high integration in semiconductor devices, sizes of the devices and the thickness of barrier layers have been smaller. Thus, there may be a higher probability that the oxygen penetrates into the barrier layer.

SUMMARY OF THE INVENTION

An object of the present invention is to provide a semiconductor device having an oxygen barrier layer and method of making the same. The oxygen barrier layer is less permeable to oxygen than a conventional oxygen barrier layer between a ferroelectric capacitor and a contact plug. Another object of the present invention is to provide a semiconductor device having a barrier layer and method of making the same, and though oxygen may enter into the barrier layer between a ferroelectric capacitor and a contact plug at a high processing temperature, the barrier layer stops the oxygen from penetrating into a boundary surface of the contact plug.

According to the present invention, a semiconductor device includes a capacitor having a triple-level oxygen barrier layer pattern formed by an oxygen barrier metal layer, a material layer which forms a conductive solid solution with the oxygen barrier metal layer and oxygen, and an oxygen barrier metal layer on an interlayer dielectric with a contact plug. The capacitor also has an electrode electrically connecting to the oxygen barrier layer and contract with a ferroelectric film.

A wetting layer is typically formed between the oxygen barrier layer and the contact plug to obtain a good adhesion or on ohmic contact. It is desirable that the wetting layer is formed by titanium, tantalum or compounding therewith. The electrode of capacitor is generally formed by platinum that is resistant to heat and oxidization.

It is desirable that the oxygen barrier metal layer is comprised of iridium, and that an iridium oxide layer is formed between the oxygen barrier metal layer and a capacitor electrode. When the ferroelectric film is annealed at an oxygen environment, the iridium oxide layer can provide oxygen to the ferroelectric film, and at the same time can prevent unwanted reactions between the barrier layer and capacitor electrode. The ferroelectric film is typically formed by PZT (PbZrTiO$_3$), BST(BaSrTiO$_3$), BSTN, BSTT, etc.

According to a method for forming a semiconductor device of the present invention, an interlayer dielectric having a contact plug is formed on a substrate. An oxygen barrier layer is formed by depositing a barrier metal layer electrically contacted to the contact plug on the interlayer dielectric. A bottom electrode is formed on the oxygen barrier layer so as to electrically contact with the oxygen barrier layer. The oxygen barrier layer is formed by inserting a transition metal such as titanium or tantalum between two barrier metal layers as oxygen barriers.

It is desirable to deposit a barrier metal oxide layer before forming a capacitor electrode on the oxygen barrier layer. The barrier metal oxide layer needs conductivity. The barrier metal is adequate for functioning as an oxygen barrier itself, i.e., previous metal except platinum such as osmium, ruthenium, iridium, etc. In case that an oxide layer of the barrier metal is formed, an initial annealing step to remove free oxygen is preferred; it is desirable that unstable oxygen content at an initial step for depositing is solved by annealing.

A wetting layer, e.g., titanium is first formed between the oxygen barrier layer and the contact plug to form a good adhesion layer and an ohmic contact.

BRIEF DESCRIPTION OF THE DRAWINGS

The present invention will be more clearly understood from the following description with reference to the accompanying drawings, wherein.

DESCRIPTION OF THE PREFERRED EMBODIMENT

Referring to FIGS. 1 to 7, a preferred embodiment of the present invention will be described below.

FIGS. 1 to 5 are cross sectional diagrams illustrating the steps for forming a FRAM (Ferroelectric Random Access Memory device) in accordance with the present invention.

Figure 1:
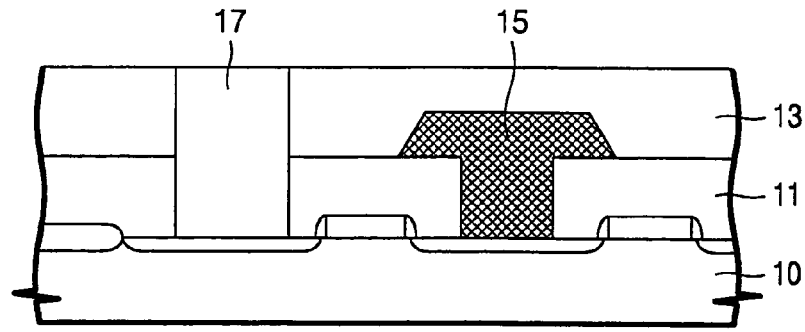
FIGS. 1 to 5 are cross sectional diagrams illustrating the steps for forming a FRAM (Ferroelectric Random Access Memory device) in accordance with the present invention.

Referring to FIG. 1, field isolation (field oxidation) is formed in a substrate 10, and MOS transistor structure having a gate, source and drain is constructed on the substrate 10. A first interlayer dielectric 11 is formed over the substrate 10 and the MOS transistor structure. After patterning the first interlayer dielectric 11 to form a bit line contact hole, a contact plug filling the bit line contact hole and bit line 15 connected to the contact plug are formed by stacking and patterning a first conductive film. A second interlayer dielectric 13 is formed on the bit line 15. A storage node contact hole is formed in the first and second interlayer dielectrics 11 and 13 by patterning, and the contact hole is filled by stacking a second conductive film. A storage node contact plug 17 is formed by an etching process for planarization such as a chemical mechanical polishing (CMP) step or an etch back process.

Figure 2:
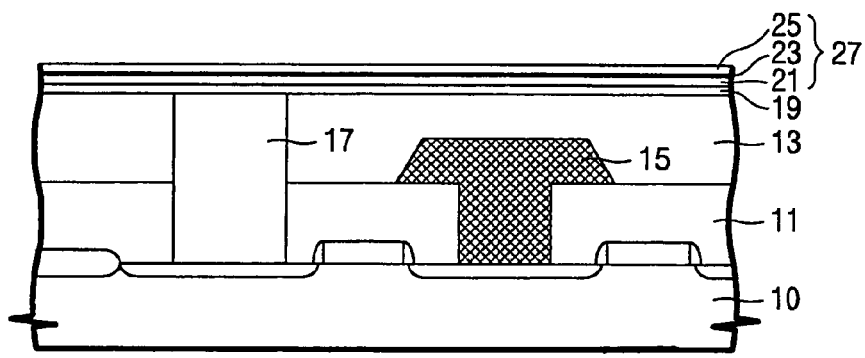

Referring to FIG. 2, an oxygen barrier layer 27 is formed on the substrate 10 with the storage node contact plug 17. The oxygen barrier layer 27 is formed by depositing an iridium layer 21, a titanium layer 23, and an iridium layer 25 sequentially. First, the iridium layer 21 has an oxygen barrier metal properties. The iridium layer 21 can be formed by sputter deposition. As shown in FIG. 2, before deposition of the iridium layer 21, a titanium layer 19 may be formed as a wetting layer. Since there is a wide difference of the coefficient of thermal expansion between the second interlayer dielectric 13 of a silicon oxide layer and the iridium layer 21 of a metal layer, the titanium layer 19 is needed to prevent interlayer exfoliation by heat stress in following steps. The wetting layer can be formed by titanium, titanium silicide (TiSi), titanium nitride (TiN), titanium silicide nitride (TiSiN), titanium aluminium nitride (TiAlN), or like titanium containing materials. Tantalum, tantalum silicide (TaSi), tantalum nitride (TaN), tantalum silicide nitride (TaSiN), tantalum aluminium nitride (TaAlN), or like tantalum containing materials are also used for the wetting layer.

After stacking the titanium layer 19 as a wetting layer and the iridium layer 21 of barrier metal, the titanium layer 23 is formed overlying the layers 19 and 21. Tantalum layer having an equal effect to the titanium may be replaced with the titanium layer 23. The titanium layer 23 is positioned between iridium layers 21 and 25, and is formed by less than 500 Å, desirably less than 200 Å in thickness so as to be an alloy with iridium. The titanium layer 23 is practically formed as a conductive titanium oxide or an alloy of iridium-titanium-oxygen by combining with oxygen penetrated into the iridium layer 25. The oxygen of the titanium oxide or the alloy layer must penetrate into again the iridium layer 21, thus the oxygen does not reach the surface of the storage node contact plug 17. It is desirable that the titanium layer 23 is deposited thinly to form the iridium-titanium-oxygen layer as an oxygen barrier having minute grains. Therefore, in following steps for a ferroelectric film, even if only a limited amount of oxygen penetrates the iridium layer as an oxygen barrier in an oxygen environment with high temperature, the titanium layer or iridium-titanium-oxygen layer prevents the oxygen from spreading to the boundary surface of the contact plug.

Figure 3:
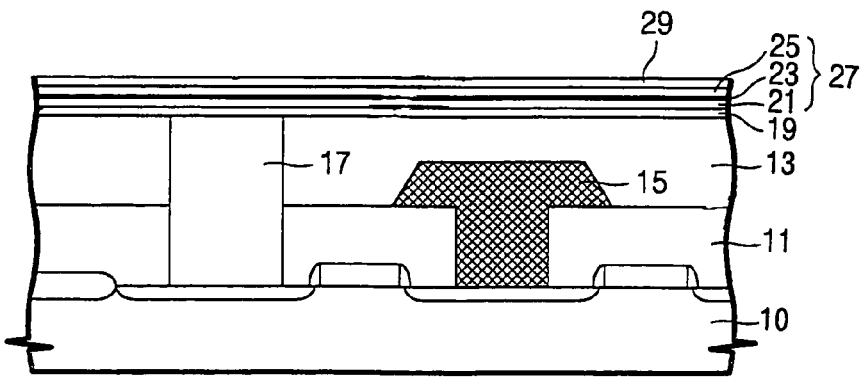

Referring to FIG. 3, an iridium oxide layer 29 is formed on a triple-layer of oxygen barrier layer 27 to improve fatigue characteristic of FRAM cell. The FRAM of high quality must have a good endurance for writing and reading repeatedly. If adequate oxygen is not provided in forming the ferroelectric film of a capacitor, gaps may be formed on the ferroelectric film. Moreover, many gaps greatly exacerbate the endurance or data retention of the ferroelectric capacitor. At a forming step for a ferroelectric film, an iridium oxide layer between the oxygen barrier layer and electrode of the ferroelectric capacitor acts as an oxygen provider to the ferroelectric film, and thereby the gaps on the ferroelectric film are reduced. Meanwhile, it may occur, at an initial step for evaporating the iridium oxide layer, that oxygen are much supplied to the boundary surface of the contact plug due to unstable composition ratio between iridium and oxygen (it is desired to be 1:2). Therefore, annealing is preferably utilized after depositing the iridium oxide layer. The annealing occurs at a temperature 400° C. The annealing not only can prevent undue oxygen supplement, but also reduce unnecessary stress in the substrate. Further, in a case that the iridium layer directly contacts with a platinum electrode in a forming step of platinum electrode, the iridium layer can prevent from obstacle to crystalline growth when iridium is diffused into platinum and the ferroelectric film is formed later.

Figure 4:
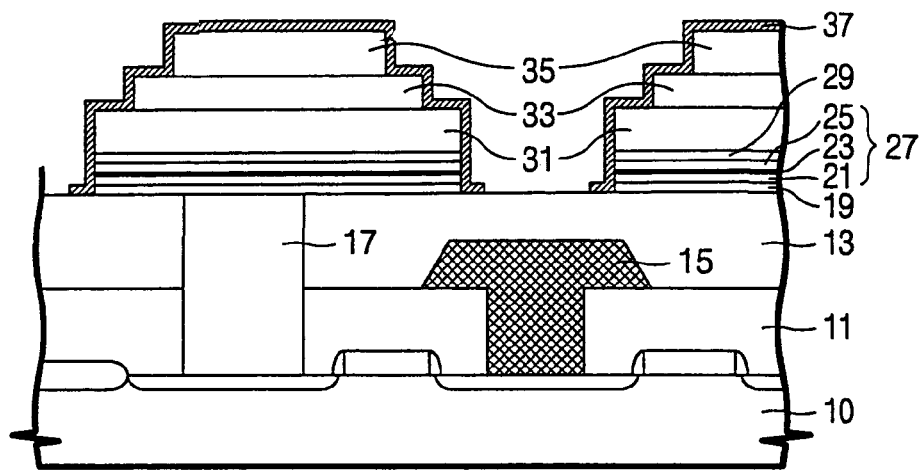

According to FIG. 4, a platinum electrode layer 31 is deposited overlying an iridium oxide layer 29, and then a ferroelectric layer 33 is deposited on the platinum electrode layer 31. perovskite crystalline structure needs to increase function of the ferroelectric layer 33. To make perovskite crystalline structure, the ferroelectric layer 33 is annealed at an adequate oxygen environment with 700° C. during about 10 minutes. In the oxygen annealing, the ferroelectric layer 33 is reformed to have the perovskite crystalline structure. Oxygen penetrated into the iridium layer 25 as an oxygen barrier metal of the oxygen barrier layer 27 combines with iridium and titanium in the titanium layer 23, and practically forms an alloy layer of iridium-titanium-oxygen. Subsequently, a top electrode 35 is deposited on the ferroelectric layer 33. The top electrode 35 may be composed of an alloy layer of iridium layer and iridium oxide layer, or platinum layer. Top electrode 35, ferroelectric film 35, and platinum layer 31 as a bottom electrode are subsequently patterned. On the surface of the capacitor, a capping layer 37 is deposited and patterned.

Figure 5:
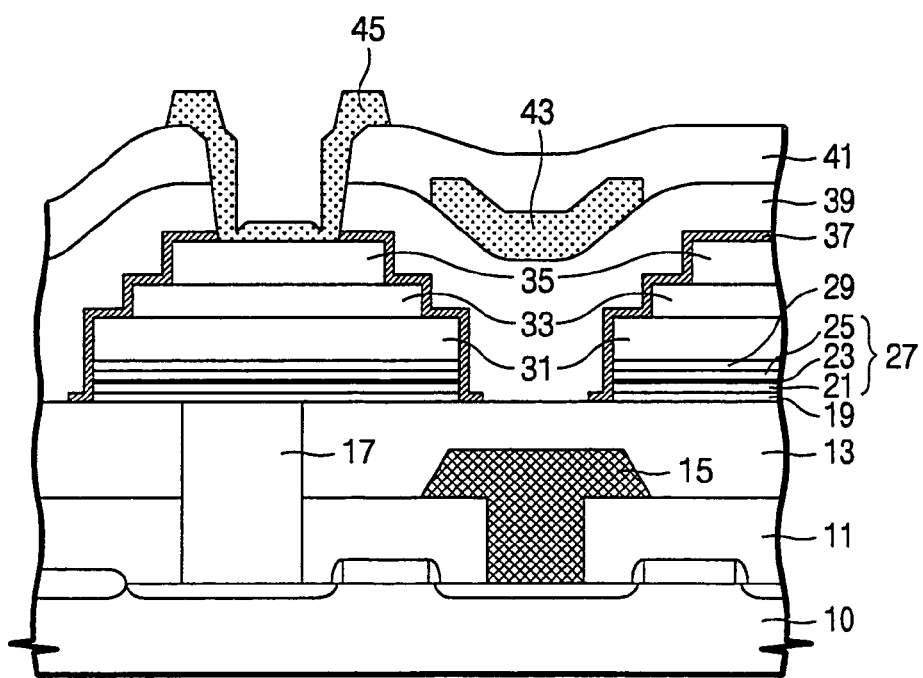

Referring to FIG. 5, after forming the capping layer 37, a third interlayer dielectric 39, aluminum interconnection layer 43, a fourth interlayer dielectric 41, and electrode 45 connected to the top electrode of capacitor are deposited and arranged. As a result, FRAM cell is made to a high integrated 1-transistor/1-capacitor.

Figure 6:
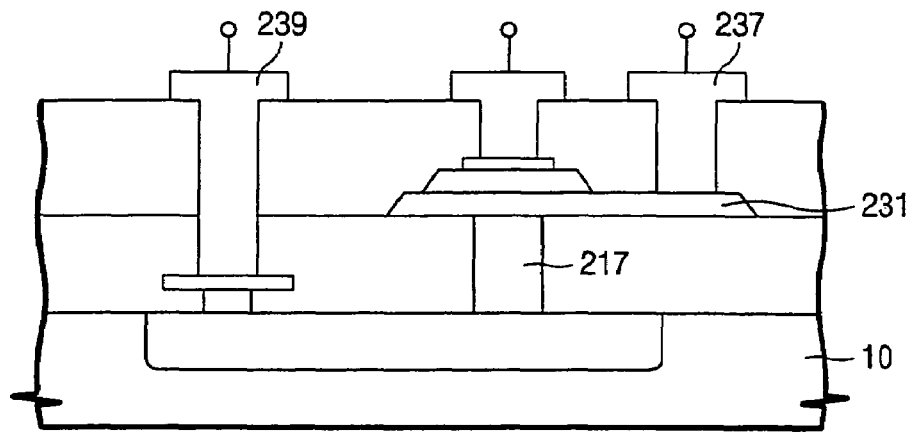
FIG. 6 is a partial cross sectional diagram illustrating a test module for confirming an effect of the present invention.

FIG. 6 is a partial cross sectional diagram illustrating a test module for confirming an effect of the present invention. A node 237 is connected to bottom electrode and oxygen barrier layer 231, bottom of the bottom electrode and oxygen barrier layer 231 is connected to a part of an active region of the substrate 10 through contact plug 217, and other part of the active region is connected to a node 239. Contact resistance of the oxygen barrier layer can be measured by in series connecting 1000 devices of FIG. 6.

Figure 7:
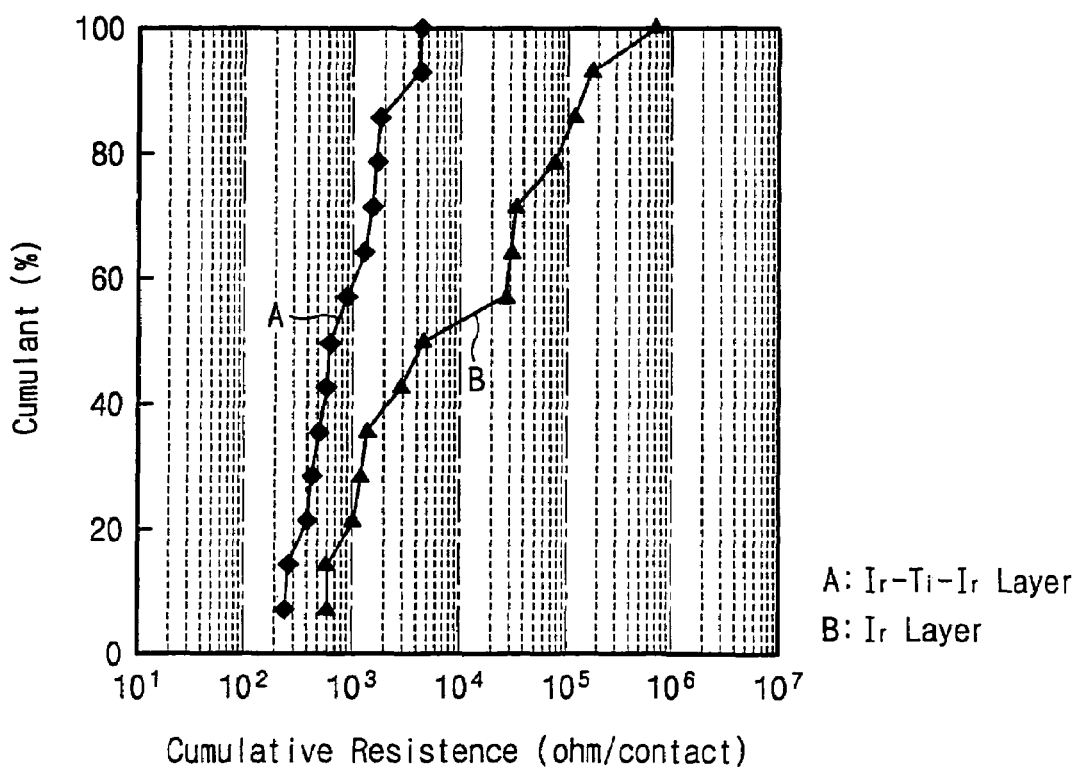
FIG. 7 is a graph illustrating a cumulative resistance of an oxide barrier layer and an iridium layer of the present invention in accordance with the test module of FIG. 6.

In an architecture of the oxygen barrier layer in accordance with the present invention, if the contact plug has size of 0.4 µm, plots A of FIG. 7 are obtained as contact resistance. Plots B are contact resistance of same condition with plots A in a single-level oxygen barrier layer of iridium. The contact resistance is measured after heat treatment of the ferroelectric material, and it can be seen low contact resistance enough to drive the ferroelectric device (The average contact resistance is 1000 Ω). Compared with the single-level layer of iridium, the contact resistance is very low.

As shown in FIG. 7, in forming a ferroelectric capacitor, oxygen annealing to increase the function of the ferroelectric material assures to prevent the contact plug from oxidation in the bottom electrode of the capacitor and the boundary surface of the contact plug, and therefrom the contact resistance can be maintained to low and stable condition.

What is claimed:

1. A method of forming a semiconductor device, the method comprising:
    forming an interlayer dielectric and a contact plug on a substrate, the interlayer dielectric surrounding the contact plug;
    depositing a first barrier metal layer on the interlayer dielectric and the contact plug;
    depositing a material layer on the first barrier metal layer, the material layer contiguous with the first barrier metal layer;
    depositing a second barrier metal layer on the material layer to form an oxygen barrier layer that includes the first barrier metal layer, the material layer, and the second barrier metal layer, the second barrier metal layer contiguous with the material layer; and
    forming a bottom electrode layer on the second barrier metal layer, the bottom electrode layer in electrical contact with the second barrier metal layer,
    wherein forming the oxygen barrier layer comprises depositing a single elemental layer as the first barrier metal layer, and
    wherein depositing the material layer comprises depositing a layer consisting of titanium or tantalum.

2. The method of claim 1, further comprising:
    forming a ferroelectric layer on the bottom electrode layer, the ferroelectric layer contiguous with the bottom electrode layer;
    forming a top electrode layer on the ferroelectric layer, the top electrode layer contiguous with the ferroelectric layer;
    etching the top electrode layer, the ferroelectric layer, the bottom electrode layer, and the oxygen barrier layer using a mask pattern to form a capacitor pattern on the interlayer dielectric; and
    covering the capacitor pattern with a capping layer.

3. The method of claim 1, further comprising, before forming the bottom electrode layer, depositing an oxide on the second barrier metal layer, the oxide including an oxide of the second barrier metal layer.

4. The method of claim 3, further comprising, before forming the bottom electrode layer, annealing the oxide.

5. The method of claim 1, wherein depositing the material layer comprises oxidizing a portion of the first barrier metal layer to form a conductive solid solution.

6. The method of claim 1, wherein depositing the first barrier metal layer comprises depositing a first layer consisting of iridium, wherein depositing the material layer comprises depositing a layer less than 500 Å in thickness, and depositing the second barrier metal layer comprises depositing a second layer consisting of iridium.

7. The method of claim 1, wherein the material layer is capable of combining with oxygen to form a conductive solid solution.

\* \* \* \* \*